United States Patent
Lee et al.

(10) Patent No.: US 9,768,240 B2
(45) Date of Patent: Sep. 19, 2017

(54) THIN FILM TRANSISTOR ARRAY SUBSTRATE AND ORGANIC LIGHT-EMITTING DIODE DISPLAY INCLUDING THE SAME

(71) Applicant: Samsung Display Co., Ltd., Yongin, Gyeonggi-Do (KR)

(72) Inventors: Jungkyu Lee, Yongin (KR); Dohyun Kwon, Yongin (KR); Taehyun Kim, Yongin (KR); Suyeon Sim, Yongin (KR); Seunghwan Cho, Yongin (KR); Jongmo Yeo, Yongin (KR); Joongeol Lee, Yongin (KR)

(73) Assignee: Samsung Display Co., Ltd., Gyeonggi-do (KR)

( * ) Notice: Subject to any disclaimer, the term of this patent is extended or adjusted under 35 U.S.C. 154(b) by 0 days.

(21) Appl. No.: 14/712,703

(22) Filed: May 14, 2015

(65) Prior Publication Data
US 2016/0099300 A1    Apr. 7, 2016

(30) Foreign Application Priority Data
Oct. 6, 2014   (KR) .......................... 10-2014-0134483

(51) Int. Cl.
*H01L 27/32*  (2006.01)
*H01L 27/12*  (2006.01)

(52) U.S. Cl.
CPC ........ *H01L 27/3265* (2013.01); *H01L 27/124* (2013.01); *H01L 27/1255* (2013.01)

(58) Field of Classification Search
CPC ............ H01L 27/3265; H01L 27/3262; H01L 27/3276
See application file for complete search history.

(56) References Cited

U.S. PATENT DOCUMENTS

| | | | |
|---|---|---|---|
| 2005/0190312 A1 | 9/2005 | Yang | |
| 2006/0267491 A1* | 11/2006 | Koo | ..................... H01L 27/3276 313/511 |
| 2007/0120457 A1* | 5/2007 | Goh | ..................... H01L 51/5203 313/463 |

(Continued)

FOREIGN PATENT DOCUMENTS

| | | |
|---|---|---|
| KR | 10-2007-0038193 A | 4/2007 |
| KR | 10-2010-0076600 A | 7/2010 |

(Continued)

*Primary Examiner* — Michael Jung
*Assistant Examiner* — Mikka Liu
(74) *Attorney, Agent, or Firm* — Knobbe Martens Olson & Bear LLP

(57) ABSTRACT

A thin film transistor (TFT) array substrate and organic light-emitting diode (OLED) display including the same are disclosed. In one aspect, the array substrate includes a substrate, a driving TFT formed over the substrate and including a driving gate electrode, and a storage capacitor including a first electrode electrically connected to the driving gate electrode and a second electrode formed over and insulated from the first electrode. The array substrate also includes an interlayer insulating film at least partially covering the first electrode and a driving voltage line formed over the interlayer insulating film and configured to supply a voltage to the driving TFT. The driving voltage line is formed on the same layer as the second electrode.

21 Claims, 6 Drawing Sheets

(56) References Cited

U.S. PATENT DOCUMENTS

| | | |
|---|---|---|
| 2010/0163881 A1 | 7/2010 | Kang et al. |
| 2014/0034923 A1 | 2/2014 | Kim et al. |
| 2015/0243722 A1* | 8/2015 | Kwon ................. H01L 27/3262 257/40 |

FOREIGN PATENT DOCUMENTS

| | | |
|---|---|---|
| KR | 10-2013-0062498 A | 6/2013 |
| KR | 10-2014-0018623 A | 2/2014 |

* cited by examiner

THIN FILM TRANSISTOR ARRAY SUBSTRATE AND ORGANIC LIGHT-EMITTING DIODE DISPLAY INCLUDING THE SAME

CROSS-REFERENCE TO RELATED APPLICATIONS

This application claims the benefit of Korean Patent Application No. 10-2014-0134483, filed on Oct. 6, 2014, in the Korean Intellectual Property Office, the disclosure of which is incorporated herein in its entirety by reference.

BACKGROUND

Field of the Invention

The described technology generally relates to a thin film transistor array substrate and an organic light-emitting diode display including the same.

Description of the Related Technology

Generally, an organic light-emitting diode (OLED) display has a matrix of pixels each having an OLED including a hole injection electrode, an electron injection electrode, and an organic emission layer formed between the hole injection electrode and the electron injection electrode. In OLED technology, light is generated when excitons, formed by the combination of holes injected from the hole injection electrode and electrons injected from the electron injection electrode in the organic emission layer, fall from an excited state into a ground state.

An OLED display is self-emissive and thus does not need a light source. Thus, an OLED display can be driven at a low voltage and configured to be thin and lightweight. Furthermore, OLED displays are considered the next-generation display because of their favorable characteristics such as wide viewing angles, high contrast, and fast response times.

SUMMARY OF CERTAIN INVENTIVE ASPECTS

One inventive aspect is a thin film transistor (TFT) array substrate.

Another aspect is an OLED display including the thin film transistor array substrate.

Another aspect is a thin film transistor array substrate that includes a driving thin film transistor provided on a substrate; a storage capacitor including a first electrode connected to a driving gate electrode of the driving thin film transistor, and a second electrode provided above the first electrode and insulated from the first electrode; an interlayer insulating film covering the first electrode; and a driving voltage line formed on the interlayer insulating film and supplying a voltage to the driving thin film transistor, wherein the driving voltage line is formed on the same layer as the second electrode.

The thin film transistor array substrate can further include a first via layer which is formed on the interlayer insulating film and includes a first opening portion and a second opening portion exposing portions of the interlayer insulating film.

The second electrode can be formed in the first opening portion.

The driving voltage line can be formed in the second opening portion.

The thin film transistor array substrate can further include a switching thin film transistor provided on the substrate, wherein the second electrode can be formed simultaneously with a source electrode and a drain electrode of the switching thin film transistor.

The thin film transistor array substrate can further include a second via layer formed on an upper portion of the first via layer and including a first via hole and a second via hole, and a bridge formed on an upper portion of the second via layer and connecting the second electrode and the driving voltage line.

The interlayer insulating film can be formed of an organic material.

The driving gate electrode and the first electrode can be formed as one body on the same layer.

Another aspect is a thin film transistor array substrate that includes a driving thin film transistor and a switching thin film transistor which are provided on a substrate; a storage capacitor including a first electrode connected to a driving gate electrode of the driving thin film transistor, and a second electrode provided above the first electrode and insulated from the first electrode; an interlayer insulating film covering the first electrode and a gate electrode of the switching thin film transistor; and a first via layer formed on the interlayer insulating film and including a first opening portion and a second opening portion exposing portions of the interlayer insulating film, wherein the second electrode is formed in the first opening portion and is formed simultaneously with a source electrode and a drain electrode of the switching thin film transistor.

The thin film transistor array substrate can further include a driving voltage line formed on the interlayer insulating film and supplying a voltage to the driving thin film transistor, wherein the driving voltage line can be formed in the second opening portion.

The driving voltage line can be formed on the same layer as the second electrode.

The interlayer insulating film can be formed of an organic material.

The driving thin film transistor and the storage capacitor can be formed such that at least a portion of one of the driving thin film transistor or the storage capacitor overlaps the other.

Another aspect is an OLED display that includes a display region including a plurality of pixels and a non-display region formed around the display region, wherein each of the pixels includes a driving thin film transistor provided on a substrate; a storage capacitor including a first electrode connected to a driving gate electrode of the driving thin film transistor, and a second electrode provided above the first electrode and insulated from the first electrode; an interlayer insulating film covering the first electrode; and a driving voltage line formed on the interlayer insulating film and supplying a voltage to the driving thin film transistor, and the driving voltage line is formed on the same layer as the second electrode.

The display can further include a first via layer which is formed on the interlayer insulating film and includes a first opening portion and a second opening portion exposing portions of the interlayer insulating film.

The second electrode can be formed in the first opening portion and the driving voltage line can be formed in the second opening portion.

The interlayer insulating film can be formed of an organic material.

Another aspect is a thin film transistor (TFT) array substrate comprising a substrate, a driving TFT formed over the substrate and comprising a driving gate electrode, and a storage capacitor comprising a first electrode electrically connected to the driving gate electrode and a second electrode formed over and insulated from the first electrode. The TFT array substrate also comprises an interlayer insulating film at least partially covering the first electrode and a driving voltage line formed over the interlayer insulating film and configured to supply a voltage to the driving TFT, wherein the driving voltage line is formed on the same layer as the second electrode.

The above TFT array substrate further comprises a first via layer formed over the interlayer insulating film and having first and second opening portions exposing portions of the interlayer insulating film.

In the above TFT array substrate, the second electrode is formed in the first opening portion.

In the above TFT array substrate, the driving voltage line is formed in the second opening portion.

The above TFT array substrate further comprises a switching TFT formed over the substrate and comprising source and drain electrodes formed of the same material as the second electrode.

The above TFT array substrate further comprises a second via layer formed over an upper portion of the first via layer and having a first via hole and a second via hole. The above TFT array substrate further comprises a bridge formed over an upper portion of the second via layer and configured to electrically connect the second electrode to the driving voltage line.

In the above TFT array substrate, the interlayer insulating film is formed of an organic material.

In the above TFT array substrate, the driving gate electrode and the first electrode are formed as one body over the same layer.

Another aspect is a TFT array substrate comprising a substrate, a driving TFT and a switching TFT formed over the substrate, wherein the driving TFT comprises a driving gate electrode, and wherein the switching TFT comprises a gate, source and drain electrodes. The array substrate also comprises a storage capacitor comprising a first electrode electrically connected to the driving gate electrode and a second electrode formed over and insulated from the first electrode, an interlayer insulating film at least partially covering the first electrode and the gate electrode of the switching TFT, and a first via layer formed over the interlayer insulating film and having first and second opening portions exposing portions of the interlayer insulating film, wherein the second electrode is formed in the first opening portion and formed of the same material as the source and drain electrodes of the switching TFT.

The above TFT array substrate further comprises a driving voltage line formed over the interlayer insulating film and configured to supply a voltage to the driving TFT, wherein the driving voltage line is formed in the second opening portion.

In the above TFT array substrate, the driving voltage line is formed over the same layer as the second electrode.

In the above TFT array substrate, the interlayer insulating film is formed of an organic material.

In the above TFT array substrate, at least a portion of the driving TFT overlaps the storage capacitor.

In the above TFT array substrate, at least a portion the storage capacitor overlaps the driving TFT.

Another aspect is an organic light-emitting diode (OLED) display comprising i) a display region comprising a plurality of pixels and ii) a non-display region surrounding the display region. Each of the pixels comprises a substrate, a driving thin film transistor (TFT) formed over the substrate and comprising a driving gate electrode, and a storage capacitor comprising a first electrode electrically connected to the driving gate electrode and a second electrode formed over and insulated from the first electrode. Each pixel also comprises an interlayer insulating film at least partially covering the first electrode and a driving voltage line formed over the interlayer insulating film and configured to supply a voltage to the driving TFT, wherein the driving voltage line is formed on the same layer as the second electrode.

The above display further comprises a first via layer formed over the interlayer insulating film and having first and second opening portions exposing portions of the interlayer insulating film.

In the above display, the second electrode is formed in the first opening portion, and wherein the driving voltage line is formed in the second opening portion.

In the above display, the interlayer insulating film is formed of an organic material.

The above display further comprises a switching TFT formed over the substrate and comprising source and drain electrodes formed of the same material as the second electrode.

The above display further comprises a second via layer formed over an upper portion of the first via layer and having a first via hole and a second via hole. The above display further comprises a bridge formed over an upper portion of the second via layer and electrically connecting the second electrode to the driving voltage line.

DETAILED DESCRIPTION OF CERTAIN INVENTIVE EMBODIMENTS

Figure 1:
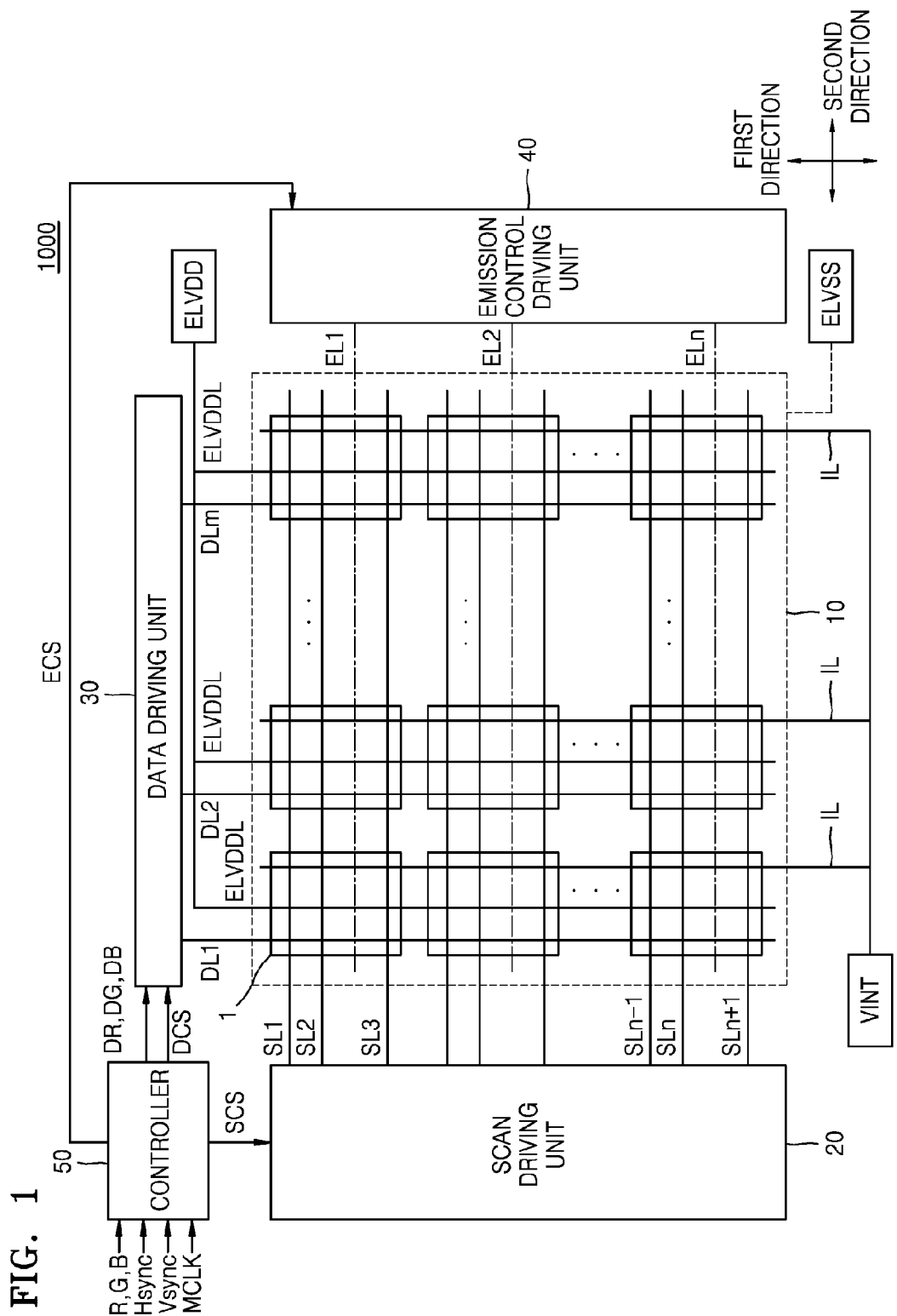
FIG. 1 is a schematic block diagram of an OLED display according to an embodiment.

As the described technology allows for various changes and numerous embodiments, exemplary embodiments will be illustrated in the drawings and described in detail in the written description. However, this is not intended to limit the described technology to particular modes of practice, and it is to be appreciated that all changes, equivalents, and substitutes that do not depart from the spirit and technical scope of the described technology are encompassed in the described technology. In the description of exemplary embodiments, like elements are denoted by like reference numerals in the drawings although they are illustrated in different embodiments.

While such terms as "first" and "second" can be used to describe various components, such components must not be limited to the above terms. The above terms are used only to distinguish one component from another.

The terms used in the present specification are merely used to describe exemplary embodiments and are not intended to limit the described technology. An expression used in the singular encompasses the expression of the plural, unless it has a clearly different meaning in the context. In the present specification, it is to be understood that the terms such as "include," "comprise," and "have" are intended to indicate the existence of the features, numbers, steps, actions, components, parts, or combinations thereof disclosed in the specification, and are not intended to preclude the possibility that one or more other features, numbers, steps, actions, components, parts, or combinations thereof can exist or can be added. As used herein, the term "and/or" includes any and all combinations of one or more of the associated listed items.

Reference will now be made in detail to exemplary embodiments, examples of which are illustrated in the accompanying drawings. In this disclosure, the term "substantially" includes the meanings of completely, almost completely or to any significant degree under some applications and in accordance with those skilled in the art. Moreover, "formed on" can also mean "formed over." The term "connected" can include an electrical connection.

FIG. 1 is a schematic block diagram of an organic light-emitting diode (OLED) display 1000 according to an embodiment.

The OLED display 1000 includes a display 10 including a plurality of pixels 1 in a display region, a scan driving unit or scan driver 20, a data driving unit or data driver 30, an emission control driving unit or emission control driver 40, and a controller 50. A non-display region surrounds the display region.

The display 10 is formed over an area where a plurality of scanning lines SL1 through SLn+1, a plurality of data lines DL1 through DLm, and a plurality of emission control lines EL1 through ELn intersect. The display 10 includes the pixels 1 arranged substantially in a matrix shape. The data lines DL1 through DLm and a driving voltage line ELVDDL extend in a first direction, which is a column direction of FIG. 1. The scanning lines SL1 through SLn+1 and the emission control lines EL1 through ELn extend in a second direction crossing the first direction, which is a row direction of FIG. 1. In one pixel line, the number of scanning lines SL1 through SLn+1 can be different from the number of emission control lines EL1 through ELn.

Each of the pixels 1 is connected to three of the scanning lines SL1 through SLn+1 conveyed to the display 10. The scan driving unit 20 generates and transmits three scan signals to each of the pixels 1 through the scanning lines SL1 through SLn+1.

That is, the scan driving unit 20 sequentially supplies the scan signals to each of the pixels 1 through first scanning lines SL2 through SLn, second scanning lines SL1 through SLn−1, or third scanning lines SL3 through SLn+1. For example, the scan driving unit 20 sequentially supplies the scan signals to each of the pixels 1 through a first scanning line SL2, a second scanning line SL1, or a third scanning line SL3.

From an external power supply source VINT, an initialization voltage of the display 10 can be applied to an initialization voltage line IL.

Also, each of the pixels 1 is connected to one of the data lines DL1 through DLm connected to the display 10 and one of the emission control lines EL1 through ELn connected to the display 10.

The data driving unit 30 transmits a data signal to each of the pixels 1 through the data lines DL1 through DLm. Whenever the scan signal is supplied to each of the pixels 1 through the first scanning lines SL2 through SLn, the data signal is supplied to each of the pixels 1 selected by the scan signal.

The emission control driving unit 40 generates and transmits an emission control signal to each of the pixels 1 through the emission control lines EL1 through ELn. The emission control signal controls a light-emission time of the pixels 1. The emission control driving unit 40 can be omitted depending on the inner structure of the pixels 1.

The controller 50 converts a plurality of image signals R, G, and B transmitted from the outside into a plurality of image data signals DR, DG, and DB, and transmits the image data signals DR, DG, and DB to the data driving unit 30. Also, as a vertical synchronizing signal Vsync, a horizontal synchronizing signal Hsync and a clock signal MCLK are transmitted to the controller 50. Also, the controller 50 generates control signals for controlling drives of the scan driving unit 20, the data driving unit 30 and the emission control driving unit 40. Furthermore, the controller 50 respectively transmits the control signals to the scan driving unit 20, the data driving unit 30 and the emission control driving unit 40. That is, the controller 50 generates a scan driving control signal SCS for controlling the scan driving unit 20, a data driving control signal DCS for controlling the data driving unit 30, and a light-emitting driving control signal ECS for controlling the emission control driving unit 40. The controller 50 respectively transmits the control signals SCS, DCS, and ECS to the corresponding driving units 20, 30, and 40.

A first power voltage ELVDD and a second power voltage ELVSS from the outside are supplied to each of the pixels 1. The first power voltage ELVDD can be a predetermined high-level voltage, and the second power voltage ELVSS can be lower than the first power voltage ELVDD or a ground voltage. The first power voltage ELVDD is supplied to each of the pixels 1 through the driving voltage line ELVDDL.

Each of the pixels 1 emits light of predetermined brightness by a driving current which is supplied to a light-emitting diode based at least in part on the data signal transmitted through the data lines DL1 through DLm.

Figure 2:
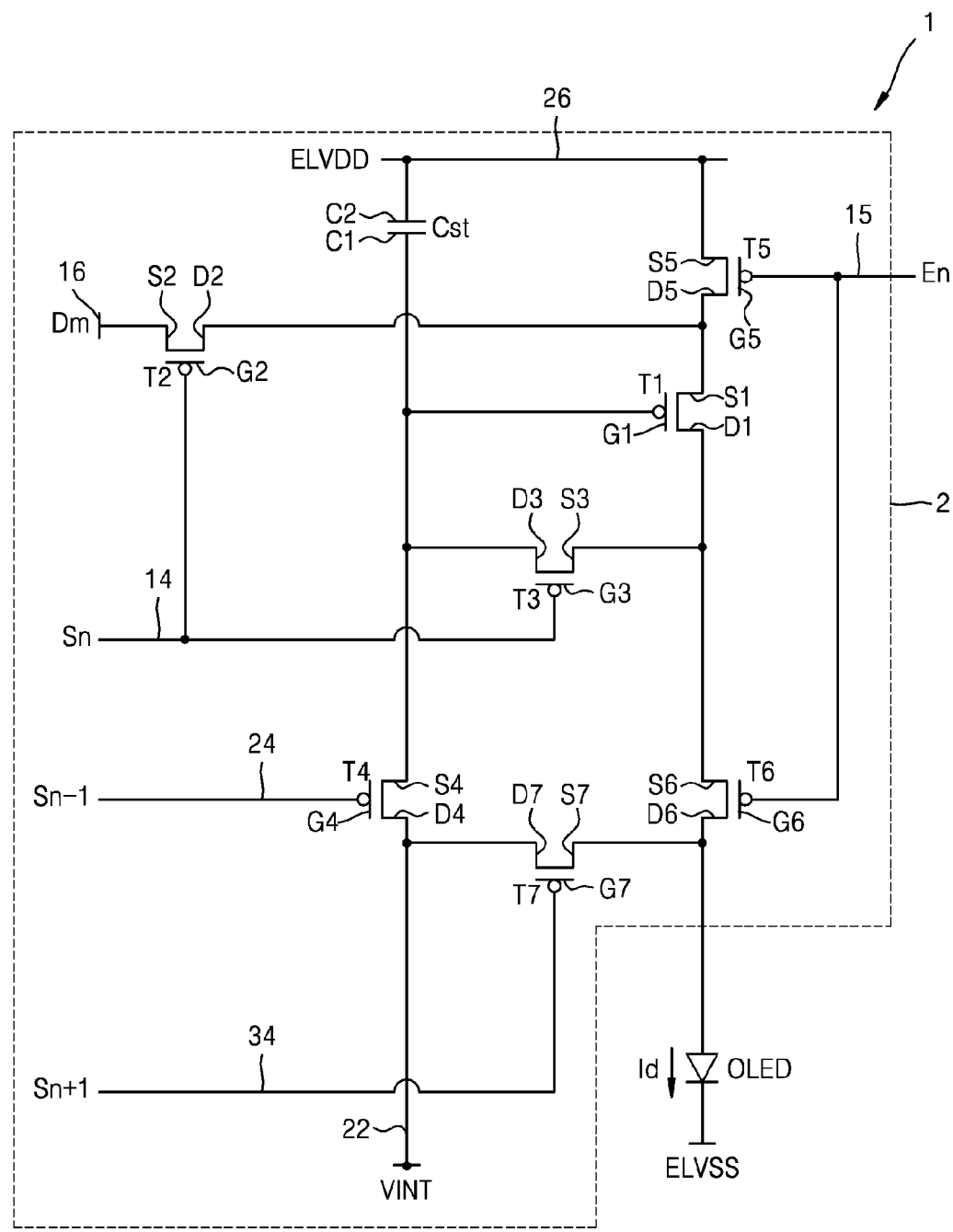
FIG. 2 is a circuit diagram of one pixel of an OLED display according to an embodiment.

FIG. 2 is a circuit diagram of the pixel 1 of the OLED display 1000 according to an embodiment.

The pixel 1 of the OLED display 1000 includes a pixel circuit 2 including a plurality of thin film transistors T1 through T7 and at least one storage capacitor Cst. The pixel 1 can also include an OLED emitting light based at least in part on the driving current supplied through the pixel circuit 2.

The thin film transistors T1 through T7 include a driving thin film transistor T1, a data transfer thin film transistor T2, a compensation thin film transistor T3, a first initialization thin film transistor T4, a first emission control thin film transistor T5, a second emission control thin film transistor T6, and a second initialization thin film transistor T7.

The pixel 1 includes a first scanning line 14 transmitting a first scan signal Sn to the data transfer thin film transistor T2 and the compensation thin film transistor T3, a second scanning line 24 transmitting a second scan signal Sn−1 to the first initialization thin film transistor T4, and a third scanning line 34 transmitting a third scan signal Sn+1 to the second initialization thin film transistor T7. The pixel 1 also includes an emission control line 15 transmitting an emission control signal En to the first emission control thin film transistor T5 and the second emission control thin film transistor T6, a data line 16 transmitting a data signal Dm, a driving voltage line 26 transmitting the first power voltage ELVDD to the elements within pixel 1, and an initialization voltage line 22 transmitting an initialization voltage VINT to the first initialization TFT T4 for initializing the driving thin film transistor T1.

A driving gate electrode G1 of the driving thin film transistor T1 is connected to a first electrode C1 of the storage capacitor Cst. For example, the driving gate electrode G1 is integrally provided on the same layer as the first electrode C1. A driving source electrode S1 of the driving thin film transistor T1 is connected to the driving voltage line 26 via the first emission control thin film transistor T5. A driving drain electrode D1 of the driving thin film transistor T1 is electrically connected to an anode of the OLED via the second emission control thin film transistor T6. As the data signal Dm is transmitted to the driving thin film transistor T1 based at least in part on a switching operation of the data transfer thin film transistor T2, the driving thin film transistor T1 supplies a driving current Id to the OLED.

A data transfer gate electrode G2 of the data transfer thin film transistor T2 is connected to the first scanning line 14. A data transfer source electrode S2 of the data transfer thin film transistor T2 is connected to the data line 16. A data transfer drain electrode D2 of the data transfer thin film transistor T2 is connected to the driving source electrode S1 of the driving thin film transistor T1 and at the same time, connected to the driving voltage line 26 via the first emission control thin film transistor T5. As the data transfer thin film transistor T2 is turned on based at least in part on the first scan signal Sn transmitted through the first scanning line 14, the data transfer thin film transistor T2 performs the switching operation of transmitting the data signal Dm transmitted through the data line 16 to the driving source electrode S1 of the driving thin film transistor T1.

A compensation gate electrode G3 of the compensation thin film transistor T3 is connected to the first scanning line 14. A compensation source electrode S3 of the compensation thin film transistor T3 is connected to the driving drain electrode D1 of the driving thin film transistor T1 and, at the same time, is connected to the anode of the OLED via the second emission control thin film transistor T6. A compensation drain electrode D3 of the compensation thin film transistor T3 is connected to the first electrode C1 of the storage capacitor Cst, a first initialization source electrode S4 of the first initialization thin film transistor T4, and the driving gate electrode G1 of the driving thin film transistor T1. As the compensation thin film transistor T3 is turned on based at least in part on the first scan signal Sn transmitted through the first scanning line 14, the driving thin film transistor T1 is diode-connected by the compensation thin film transistor T3 connecting the driving gate electrode G1 and the driving drain electrode D1 of the driving thin film transistor T1.

A first initialization gate electrode G4 of the first initialization thin film transistor T4 is connected to the second scanning line 24. A first initialization drain electrode D4 of the first initialization thin film transistor T4 is connected to the initialization voltage line 22. The first initialization source electrode S4 of the first initialization thin film transistor T4 is connected to the first electrode C1 of the storage capacitor Cst, the compensation drain electrode D3 of the compensation thin film transistor T3, and the driving gate electrode G1 of the driving thin film transistor T1. As the first initialization thin film transistor T4 is turned on based at least in part on the second scan signal Sn−1 transmitted through the second scanning line 24, the first initialization thin film transistor T4 performs initializing a voltage of the driving gate electrode G1 of the driving thin film transistor T1 by delivering the initialization voltage VINT to the driving gate electrode G1 of the driving thin film transistor T1.

A first emission control gate electrode G5 of the first emission control thin film transistor T5 is connected to the emission control line 15. A first emission control source electrode S5 of the first emission control thin film transistor T5 is connected to the driving voltage line 26. A first emission control drain electrode D5 of the first emission control thin film transistor T5 is connected to the driving source electrode S1 of the driving thin film transistor T1 and the data transfer drain electrode D2 of the data transfer thin film transistor T2.

A second emission control gate electrode G6 of the second emission control thin film transistor T6 is connected to the emission control line 15. A second emission control source electrode S6 of the second emission control thin film transistor T6 is connected to the driving drain electrode D1 of the driving thin film transistor T1 and the compensation source electrode S3 of the compensation thin film transistor T3. A second emission control drain electrode D6 of the second emission control thin film transistor T6 is electrically connected to the anode of the OLED. As the first emission control thin film transistor T5 and the second emission control thin film transistor T6 are substantially simultaneously turned on based at least in part on the emission control signal En transmitted through the emission control line 15, the first power voltage ELVDD is delivered to the OLED so that the driving current Id flows in the OLED.

A second initialization gate electrode G7 of the second initialization thin film transistor T7 is connected to the third scanning line 34. A second initialization source electrode S7 of the second initialization thin film transistor T7 is connected to the anode of the OLED. A second initialization drain electrode D7 of the second initialization thin film transistor T7 is connected to the initialization voltage line 22. As the second initialization thin film transistor T7 is turned on based at least in part on the third scan signal Sn+1 transmitted through the third scanning line 34, the second initialization thin film transistor T7 initializes the anode of the OLED.

A second electrode C2 of the storage capacitor Cst is formed such that at least a portion of the second electrode C2 overlaps the first electrode C1. The second electrode C2 can be formed on the same layer as the driving voltage line 26. The first electrode C1 of the storage capacitor Cst is connected to the driving gate electrode G1 of the driving thin film transistor T1, the compensation drain electrode D3 of the compensation thin film transistor T3, and the first initialization source electrode S4 of the first initialization thin film transistor T4.

A cathode of the OLED is connected to the second power voltage ELVSS. As the driving current Id is delivered to the OLED from the driving thin film transistor T1, the OLED emits light, thereby displaying an image.

Figure 3:
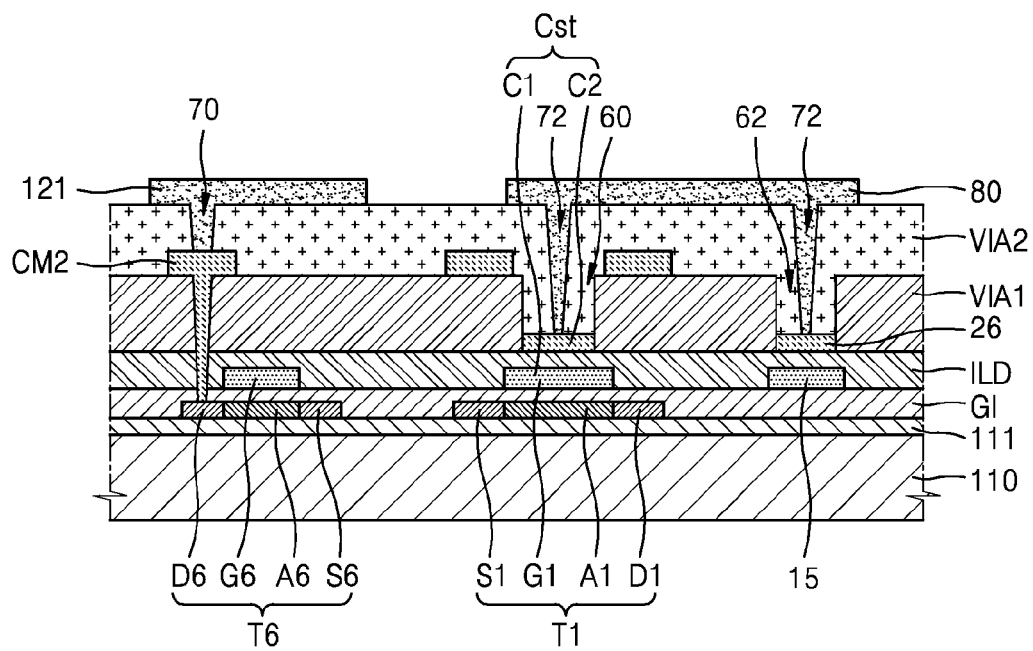
FIG. 3 is a cross-sectional view of one pixel circuit of a thin film transistor array substrate included in an OLED display according to an embodiment.

FIG. 3 is a cross-sectional view of the pixel circuit 2 of a thin film transistor array substrate included in the OLED display 1000 according to an embodiment.

The thin film transistor array substrate can include the driving thin film transistor T1 formed above a substrate 110, the storage capacitor Cst, an interlayer insulating film ILD, a first via layer VIA1, and a second via layer VIA2.

The storage capacitor Cst can include the first electrode C1 and the second electrode C2, and the interlayer insulating film ILD can be formed between the first electrode C1 and the second electrode C2.

A first wire can be formed on the same layer as the driving gate electrode G1, and the driving voltage line 26 can be included in the thin film transistor array substrate such that the driving voltage line 26 is insulated from the first wire and at least a portion of the driving voltage line 26 overlaps the first wire. Although the first wire corresponds to the emission control line 15 in FIG. 3, exemplary embodiments are not limited thereto. The first wire can be a wire formed on the same layer as the driving gate electrode G1. For example, the first wire is the first scanning line 14, the second scanning line 24, the third scanning line 34, the initialization voltage line 22, or a mesh driving voltage line 26'.

The driving voltage line 26 is formed on an upper surface of the interlayer insulating film ILD. The driving voltage line 26 can be formed substantially simultaneously as the data line 16, a first contact metal CM1, and a second contact metal CM2 and can extend in the first direction.

The thin film transistor array substrate can also include the driving thin film transistor T1, the storage capacitor Cst, a switching thin film transistor T2 through T7, the interlayer insulating film ILD, and the first via layer VIA1.

The thin film transistors can all be switching thin film transistors, except for the driving thin film transistor T1 that mainly performs a switching operation. That is, the data transfer thin film transistor T2, the compensation thin film transistor T3, the first initialization thin film transistor T4, the first emission control thin film transistor T5, the second emission control thin film transistor T6, or the second initialization thin film transistor T7 can all be switching thin film transistors. In FIG. 3, the second emission control thin film transistor T6 is a switching thin film transistor.

On an upper portion of the switching thin film transistor T2 through T7, the interlayer insulating film ILD and the first via layer VIA1 can be stacked.

For high performance by and/or high integration within the thin film transistor array substrate, various wires and various thin film transistors can be formed in the thin film transistor array substrate. Also, the wires can overlap each other, or the wires and the thin film transistors can overlap with one another. Thus, there can be a parasitic capacitance and/or signal interference in the thin film transistor array substrate.

In some embodiments, the interlayer insulating film ILD is formed of an organic material. As the interlayer insulating film ILD is formed of an organic material, a dielectric constant of the interlayer insulating film ILD can decrease and an insulating effect thereof can increase. Thus, the parasitic capacitance and/or signal interference can be reduced, and a crosstalk problem causing dark spots or patches in display devices can be improved.

Hereinafter, elements of the present embodiment will be described in detail.

Referring to FIG. 3 again, a buffer layer 111 is formed on the substrate 110. The buffer layer 111 can serve as a barrier layer and/or a blocking layer for planarizing a surface of the substrate 110 and preventing impurity ions from diffusing into the substrate 110 and moisture or the air from permeating through the substrate 100.

On the buffer layer 111, a driving semiconductor layer A1 of the driving thin film transistor T1 and a second emission control semiconductor layer A6 of the second emission control thin film transistor T6 are formed. The semiconductor layers A1 and A6 can be formed of polysilicon and can respectively include a channel region which is not doped with impurities, and a source region and a drain region which are respectively formed on both sides of the channel region and be doped with impurities. The impurities vary based on the type of thin film transistor, and N-type impurities or P-type impurities that can be used. Although not illustrated, a data transfer semiconductor layer A2 of the data transfer thin film transistor T2, a compensation semiconductor layer A3 of the compensation thin film transistor T3, a first initialization semiconductor layer A4 of the first initialization thin film transistor T4, a second initialization semiconductor layer A7 of the second initialization thin film transistor T7, a first emission control semiconductor layer A5 of the first emission control thin film transistor T5 can also be connected to the driving semiconductor layer A1 and the second emission control semiconductor layer A6 and can be formed substantially simultaneously.

A gate insulating film GI is formed over the entire surface of the substrate 110 to cover the semiconductor layers A1 through A7. The gate insulating film GI can be a film formed of an inorganic material such as silicon oxide or silicon nitride as a single layer or multiple layers. The gate insulating film GI insulates the semiconductor layers A1 through A7 and the gate electrodes G1 through G7.

On an upper portion of the gate insulating film GI, the second emission control gate electrode G6, the driving gate electrode G1, the first electrode C1, and the emission control line 15 are formed. The driving gate electrode G1 can be formed as one body with the first electrode C1.

Although not illustrated, the gate electrodes G1 through G7, the first to third scanning lines 14, 24, and 34, the mesh driving voltage line 26', and the initialization voltage line 22 can also be formed of the same material and on the same layer as the driving gate electrode G1, the second emission control gate electrode G6, the first electrode C1, and the emission control line 15.

The driving gate electrode G1, the second emission control gate electrode G6, the first electrode C1, and the emission control line 15 can be formed of one or more metals selected from molybdenum (Mo), aluminum (Al), platinum (Pt), palladium (Pd), silver (Ag), magnesium (Mg), gold (Au), nickel (Ni), neodymium (Nd), iridium (Ir), chromium (Cr), lithium (Li), calcium (Ca), titanium (Ti), tungsten (W), and copper (Cu).

According to an embodiment, the storage capacitor Cst overlaps the driving thin film transistor T1. Since the driving gate electrode G1 and the first electrode C1 are formed as one body, the storage capacitor Cst and the driving thin film transistor T1 can be formed to overlap each other. As the storage capacitor Cst is formed to overlap the driving thin film transistor T1, sufficient areas of the first electrode C1 and the second electrode C2 can be obtained. Thus, a sufficient storage capacity of the storage capacitor Cst can be obtained.

The interlayer insulating film ILD is formed over the surface of the substrate 110 to cover the driving gate electrode G1, the second emission control gate electrode G6, the first electrode C1, and the emission control line 15.

As described above, the interlayer insulating film ILD can be formed of an organic material. For example, a second interlayer insulating film ILD2 is formed of one or more materials among polyacrylates resin, epoxy resin, phenolic resin, polyamides resin, polyimides resin, unsaturated polyesters resin, poly phenylenethers resin, poly phenylenesulfides resin, and benzocyclobutene (BCB).

Thus, as parasitic capacitance and/or interference between signal wires are reduced, a crosstalk problem can be improved.

The first via layer VIA1 can be formed on an upper portion of the interlayer insulating film ILD and can include a first opening portion 60 and a second opening portion 62 which expose portions of the interlayer insulating film ILD. The second electrode C2 can be formed in the first opening 60, and the driving voltage line 26 can be formed in the second opening 62.

Since the second electrode C2 is formed to overlap the first electrode C1, the first opening portion 60 can be formed in a region overlapping the first electrode C1. The second electrode C2 can be formed in the first opening portion 60 to be in contact with the upper surface of the interlayer insulating film ILD. The second electrode C2 can also extend along the side walls of the first opening portion 60 to an upper surface of the first via layer VIA1.

However, the second electrode C2 is not limited thereto. As shown in FIG. 3, the second electrode C2 is formed only in the first opening portion 60.

The driving voltage line 26 can be formed in the second opening portion 62 to be in contact with the upper surface of the interlayer insulating film ILD. As shown in FIG. 3, the driving voltage line 26 is formed only in the second opening portion 62; however, the driving voltage line 26 is not limited thereto.

That is, the second electrode C2 and the driving voltage line 26 can be formed on the same layer. As shown in FIG. 3, the second electrode C2 is formed only in the first opening portion 60, and the driving voltage line 26 is formed only in the second opening portion 62.

In this case, the thin film transistor array substrate according to the present embodiment further includes a bridge 80 connecting the second electrode C2 and the driving voltage line 26. However, the present embodiment is not limited thereto, and the second electrode C2 and the driving voltage line 26 can be directly connected. That is, the driving voltage line 26 can extend from the second electrode C2 of the storage capacitor Cst.

On an upper portion of the first via layer VIA1, the second contact metal CM2 is formed. Although not illustrated in FIG. 3, the data line 16 and the first contact metal CM1 can be formed on the upper portion of the first via layer VIAL The driving voltage line 26 can be patterned to be formed substantially simultaneously with the second contact metal CM2, the data line 16, and the first contact metal CM1.

The second via layer VIA2 can be formed over the surface of the substrate 110 to cover wires such as the data line 16, the driving voltage line 26, the first contact metal CM1, or the second contact metal CM2. On an upper portion of the second via layer VIA2, a pixel electrode 121 can be formed. The pixel electrode 121 is connected to the second contact metal CM2 through a first via hole 70, and thus is connected to the second emission control drain electrode D6 and the second initialization source electrode S7.

In addition, as shown in FIG. 3, the second electrode C2 of the storage capacitor Cst and the driving voltage line 26 are connected through a second via hole 72 formed in the second via layer VIA2.

That is, as the bridge 80 connecting the second electrode C2 and the driving voltage line 26 is formed on the second via layer VIA2, the second electrode C2 and the driving voltage line 26 can be connected through the second via hole 72. As the second electrode C2 and the driving voltage line 26 are connected by the bridge 80, an additional mask is not needed.

The second via layer VIA2 can be formed of an insulating material. For example, the second via layer VIA2 is formed of an inorganic material, an organic material, or an organic/inorganic compound as a single layer or a plurality of layers, and is formed by various deposition methods. In some embodiments, the second via layer VIA2 is formed of one or more materials among polyacrylates resin, epoxy resin, phenolic resin, polyamides resin, polyimides resin, unsaturated polyesters resin, poly phenylenethers resin, poly phenylenesulfides resin, and BCB.

In FIG. 3, a source electrode and a drain electrode that are among source electrodes and drain electrodes of thin film transistors and are not connected to other wires are formed on the same layer as a semiconductor layer. That is, the source electrode and the drain electrode of each thin film transistor can be formed of polysilicon selectively doped with a doping material. However, the present embodiment is not limited thereto. A source electrode and a drain electrode of a thin film transistor according to another embodiment are formed on a layer different from a semiconductor layer and are respectively connected to a source region and a drain region of the semiconductor layer via contact holes.

Figure 4:
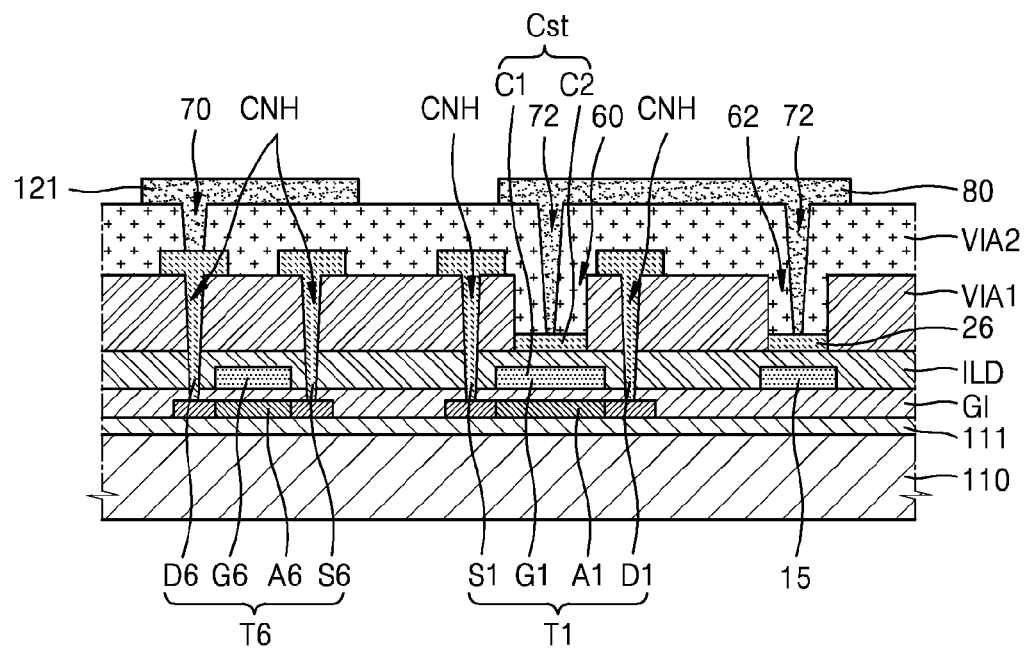
FIG. 4 is a cross-sectional view of a thin film transistor array substrate according to another embodiment.

FIG. 4 is a cross-sectional view of a thin film transistor array substrate according to another embodiment. In FIG. 4, parts or components that are the same as or similar to those in FIG. 3 are designated by the same reference numerals, and a repeated description thereof is omitted for simplification.

As described above, FIG. 4 illustrates an embodiment in which a source electrode and a drain electrode of a thin film transistor are formed on a layer different from a semiconductor layer and are respectively connected to a source region and a drain region of the semiconductor layer via contact holes.

That is, as shown in FIG. 4, a contact hole CNH is formed in the interlayer insulating film ILD and the first via layer VIA1 which are formed on upper portions of the driving thin film transistor T1 and the switching thin film transistor T2 through T7. Also, the source electrodes S1 and S6 and the drain electrodes D1 and D6 are formed on the upper portion of the first via layer VIAL Thus, the source electrodes S1 and S6 and the drain electrodes D1 and D6 can be respectively connected to source regions and drain regions of the semiconductor layers A1, and A2 through A7 of the driving thin film transistor T1 and the switching thin film transistor T2 through T7.

According to the present embodiment, the second electrode C2 is formed by patterning at substantially the same time as when the source electrodes S1 and S6 and the drain electrodes D1 and D6 are formed. Thus, since a separate mask process for forming the second electrode C2 of the storage capacitor Cst is not needed, the number of mask processes can be reduced.

FIGS. 5A through 5E are cross-sectional views which sequentially illustrate a method of manufacturing a thin film transistor array substrate according to one or more exemplary embodiments. In the present embodiment, a process of manufacturing the thin film transistor array substrate of FIG. 4 will be described.

Figure 5A:
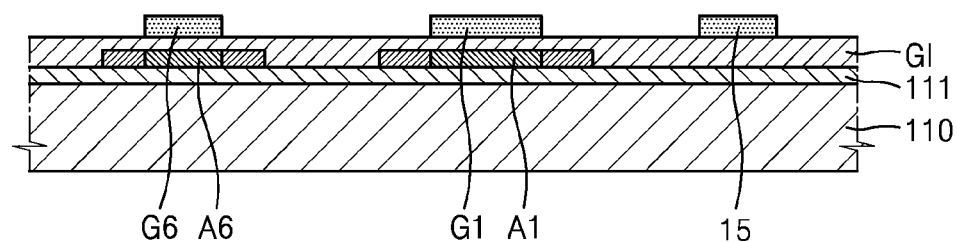
FIGS. 5A through 5E are cross-sectional views a method of manufacturing the thin film transistor array substrate of FIG. 4.

Referring to FIG. 5A, the thin film transistors T1 through T7 are formed on the substrate 110.

First, the semiconductor layers A1 though A7 of the thin film transistors T1 through T7 are formed, and the gate insulating film GI is formed on upper portions of the semiconductor layers A1 through A7.

The semiconductor layers A1 though A7 can be formed of semiconductors including amorphous silicon or crystalline silicon and can be deposited by various deposition methods. The crystalline silicon can be formed by crystallizing amorphous silicon. The amorphous silicon can be crystallized by various methods such as rapid thermal annealing (RTA), solid phase crystallization (SPC), excimer laser annealing (ELA), metal induced crystallization (MIC), metal induced lateral crystallization (MILC), or sequential lateral solidification (SLS). The semiconductor layers A1 through A7 can be patterned by a photolithography process.

The gate insulating film GI insulates the semiconductor layers A1 through A7 from the gate electrodes G1 through G7 to be formed above the semiconductor layers A1 through A7. The gate insulating film GI is formed over the surface of the substrate 110 while covering the semiconductor layers A1 through A7. The gate insulating film GI can be formed of an organic or inorganic insulator. In some embodiments, the gate insulating film GI is formed of a silicon nitride (SiNx) film, a silicon dioxide (SiO$_2$) film, hafnium (Hf) oxide, aluminum oxide, or the like. Also, the gate insulating film GI can be formed by various deposition methods such as sputtering, chemical vapor deposition (CVD), or plasma enhanced chemical vapor deposition (PECVD).

Next, the gate electrodes G1 through G7 are formed on the gate insulating film GI to have at least a portion overlapping the semiconductor layers A1 through A7. Also, the first through third scanning lines 14, 24, and 34, the emission control line 15, the initialization voltage line 22, the mesh driving voltage line 26' and the like can be formed substantially simultaneously with the gate electrodes G1 through G7.

The gate electrodes G1 through G7 can be formed of one or more metals selected from molybdenum (Mo), aluminum (Al), platinum (Pt), palladium (Pd), silver (Ag), magnesium (Mg), gold (Au), Nickel (Ni), neodymium (Nd), iridium (Ir), chromium (Cr), lithium (Li), calcium (Ca), titanium (Ti), tungsten (W), and copper (Cu).

Next, as impurities are implanted into both ends of the semiconductor layers A1 through A7 by using the gate electrodes G1 through G7 as masks, source regions and drain regions can be formed. In the case that trivalent dopants such as boron (B) are added as impurities, the layers assume p-type conductivity. In the case that pentavalent dopants such as phosphorous (P), arsenic (As), or antimony (Sb) are added as impurities, the layers assume n-type conductivity.

Figure 5B:
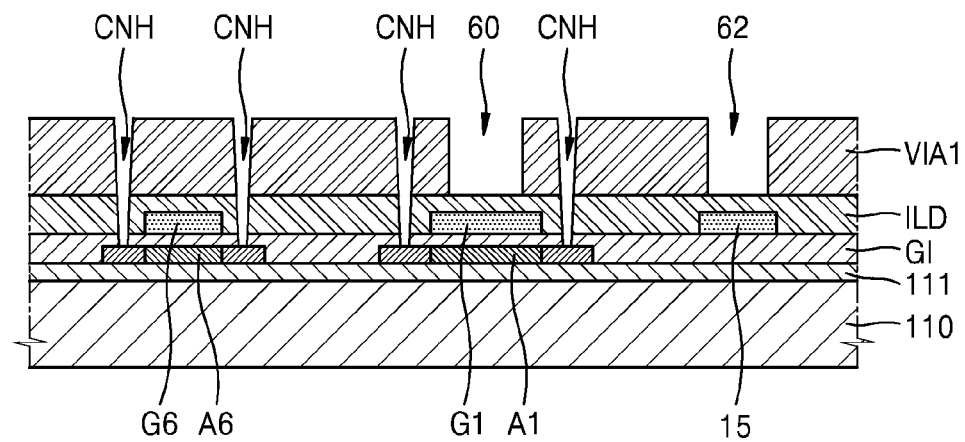

Referring to FIG. 5B, the interlayer insulating film ILD is formed over the surface of the substrate 110 to cover the gate electrodes G1 through G7. The interlayer insulating film ILD can be formed of an organic material.

Next, the first via layer VIA1 including the first opening portion 60 and the second opening portion 62 is formed on an upper portion of the interlayer insulating film ILD. Also, the contact hole CNH can be formed in the interlayer insulating film ILD and the first via layer VIA1. Forming the contact hole CNH can be performed by a patterning process and an etching process by using a mask. The etching process can be performed by various etching methods such as wet etching, dry etching, or a combination thereof.

Figure 5C:
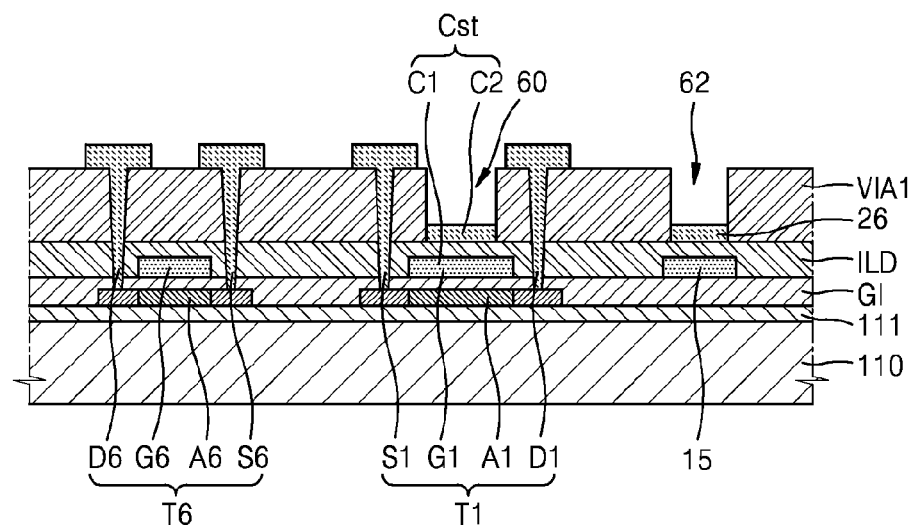

Referring to FIG. 5C, source electrodes S1 through S7 and drain electrodes D1 through D7 are formed on the upper portion of the first via layer VIA1. The source electrodes S1 through S7 and the drain electrodes D1 through D7 are respectively connected to source regions and drain regions of the corresponding semiconductor layers A1 through A7 via the contact hole CNH.

The second electrode C2 is formed in the first opening portion 60 of the first via layer VIA1 at substantially the same time as when the source electrodes S1 through S7 and the drain electrodes D1 through D7 are formed, and the driving voltage line 26 is formed in the second opening portion 62.

That is, the source electrodes S1 through S7 and the drain electrodes D1 through D7 and the second electrode C2 can be formed substantially simultaneously. Also, the second electrode C2 of the storage capacitor Cst and the driving voltage line 26 are formed on the same layer.

Figure 5D:
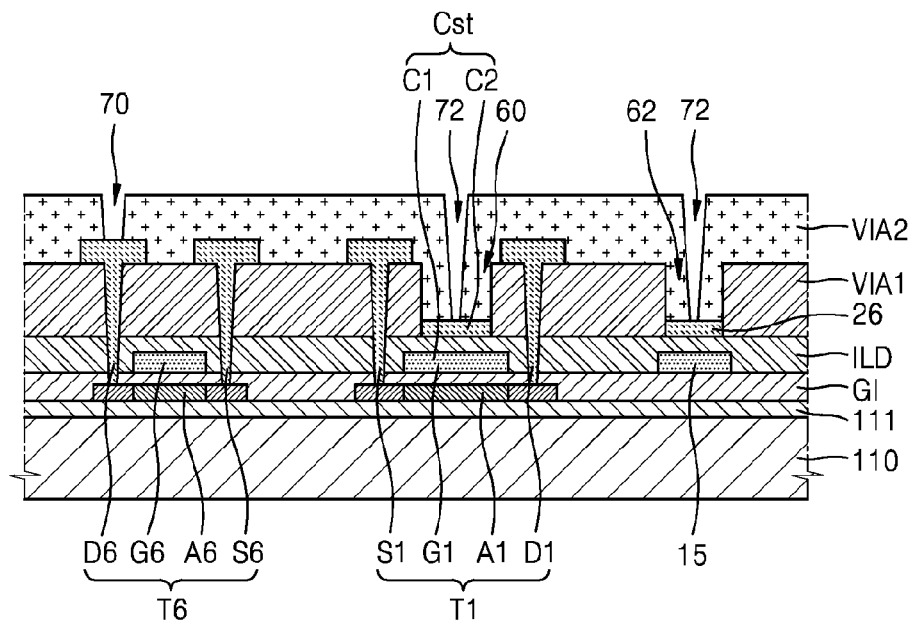

Referring to FIG. 5D, the second via layer VIA2 covering the source electrodes S1 through S7, the drain electrodes D1 through D7, and the storage capacitor Cst can be formed. Also, the first via hole 70 exposing a source electrode or a drain electrode and the second via hole 72 exposing the second electrode C2 and the driving voltage line 26 are formed.

Figure 5E:
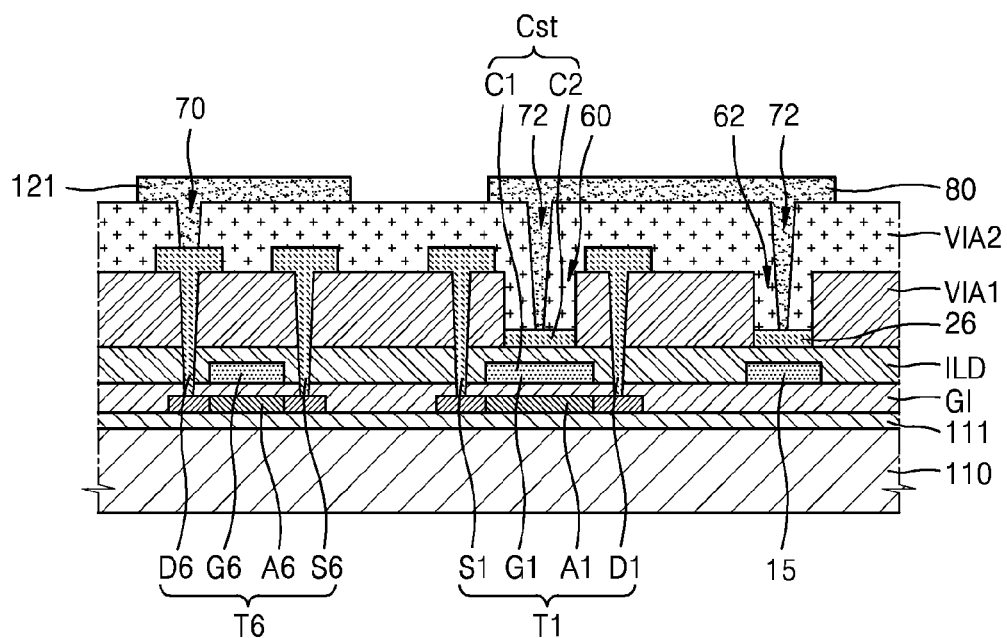

Referring to FIG. 5E, the pixel electrode 121 connected to the source electrode or the drain electrode through the first via hole 70 is formed.

Also, the bridge 80 connected to the second electrode C2 of the storage capacitor Cst and the driving voltage line 26 through the second via hole 72 is formed.

Figure 6:
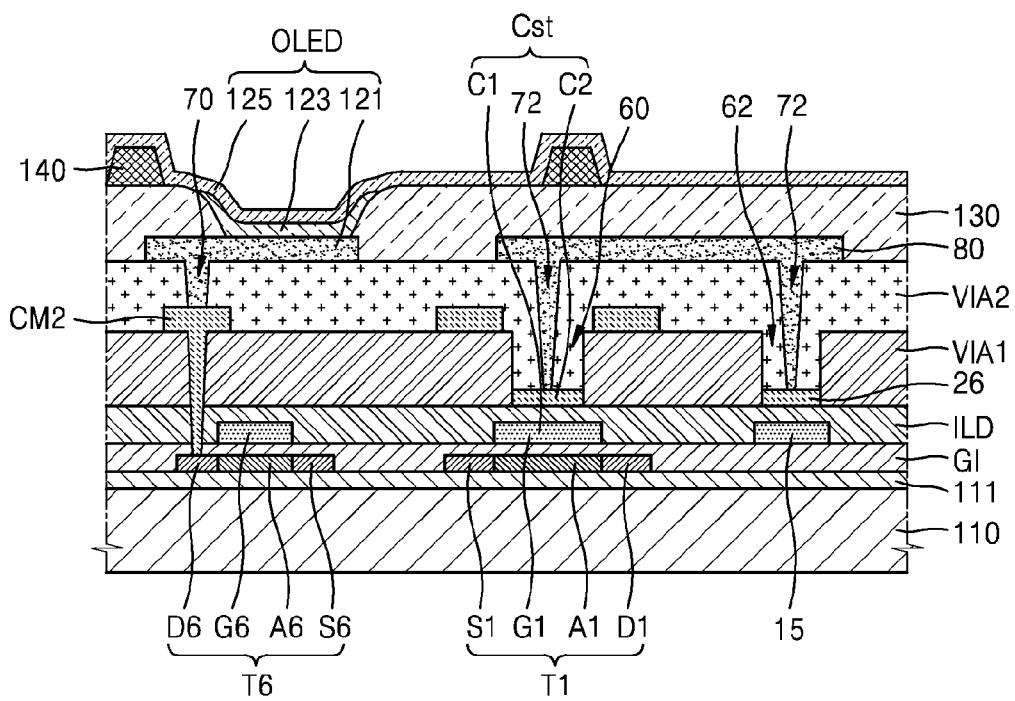
FIG. 6 is a schematic cross-sectional view of an OLED display according to an embodiment.

FIG. 6 is a schematic cross-sectional view of an OLED display according to an embodiment.

Referring to FIG. 6, the OLED display includes a thin film transistor array substrate according to exemplary embodiments. In FIG. 6, parts or components that are the same as or similar to those in FIG. 3 are designated by the same reference numerals, and a repeated description thereof is omitted for simplification.

In the OLED display, the OLED is provided in the thin film transistor array substrate. The OLED includes the pixel electrode 121, an intermediate layer 123 including an organic emission layer, and an opposite electrode 125. Also, the OLED display can further include a pixel defining layer 130 and a spacer 140.

The pixel defining layer 130 can define a pixel region and a non-pixel region. The pixel defining layer 130 can include an opening which exposes the pixel electrode 121 and can be formed to cover the thin film transistor array substrate entirely.

The pixel electrode 121, the intermediate layer 123, and the opposite electrode 125 form the OLED. Light can be generated as holes and electrons injected from the pixel electrode 121 and the opposite electrode 125 of the OLED combine with each other in the organic emission layer of the intermediate layer 123.

Although only one OLED is shown in FIG. 6, a display panel includes a plurality of OLEDs. Each of the OLEDs can have one pixel formed therein, and each pixel can emit red, green, blue, or white light.

As described above, according to the one or more of the above exemplary embodiments, a storage capacitor can be formed without an additional mask process. Also, a crosstalk problem can be improved.

It should be understood that the exemplary embodiments described therein should be considered in a descriptive sense only and not for purposes of limitation. Descriptions of features or aspects within each exemplary embodiment should typically be considered as available for other similar features or aspects in other exemplary embodiments.

While the inventive technology has been described with reference to the figures, it will be understood by those of ordinary skill in the art that various changes in form and details can be made therein without departing from the spirit and scope of the inventive concept as defined by the following claims.

What is claimed is:

1. A thin film transistor (TFT) array substrate comprising:
   a substrate;
   a driving TFT formed over the substrate and comprising a driving gate electrode, source and drain electrodes, and a driving semiconductor layer;

a gate insulating film formed over the substrate to cover the driving semiconductor layer and insulate the driving semiconductor layer from the driving gate electrode;

a storage capacitor comprising a first electrode electrically connected to the driving gate electrode and a second electrode formed over the driving TFT and formed over and insulated from the first electrode, wherein the source and drain electrodes of the driving TFT and the second electrode of the storage capacitor are separate electrodes;

an interlayer insulating film formed over the driving TFT and at least partially covering the first electrode and insulating the first electrode from the second electrode; and a driving voltage line formed over the interlayer insulating film and configured to supply a voltage to the driving TFT, wherein the driving voltage line is formed on a same layer as the second electrode.

2. The thin film transistor array substrate of claim 1, further comprising a first via layer formed over the interlayer insulating film and having first and second opening portions exposing portions of an upper surface of the interlayer insulating film.

3. The thin film transistor array substrate of claim 2, wherein the second electrode is formed in the first opening portion on the upper surface of the interlayer insulating film.

4. The thin film transistor array substrate of claim 1, further comprising a switching TFT formed over the substrate and comprising source and drain electrodes formed of a same material as the second electrode.

5. The thin film transistor array substrate of claim 1, wherein the interlayer insulating film is formed of an organic material.

6. The thin film transistor array substrate of claim 1, wherein the driving gate electrode and the first electrode are formed as one body over a layer.

7. A thin film transistor (TFT) array substrate comprising:
a substrate;
a driving TFT formed over the substrate and comprising a driving gate electrode;
a storage capacitor comprising a first electrode electrically connected to the driving gate electrode and a second electrode formed over and insulated from the first electrode;
an interlayer insulating film at least partially covering the first electrode; and
a driving voltage line formed over the interlayer insulating film and configured to supply a voltage to the driving TFT,
wherein the driving voltage line is formed on a same layer as the second electrode;
a first via layer formed over the interlayer insulating film and having first and second opening portions exposing portions of an upper surface of the interlayer insulating film,
wherein the driving voltage line is formed in the second opening portion on the upper surface of the interlayer insulating film.

8. A thin film transistor (TFT) array substrate comprising:
a substrate;
a driving TFT formed over the substrate and comprising a driving gate electrode, source and drain electrodes, and a driving semiconductor layer;
a gate insulating film formed over the substrate to cover the driving semiconductor layer and insulate the driving semiconductor layer from the driving gate electrode;
a storage capacitor comprising a first electrode electrically connected to the driving gate electrode and a second electrode formed over the driving TFT and formed over and insulated from the first electrode;
an interlayer insulating film formed over the driving TFT and at least partially covering the first electrode and insulating the first electrode from the second electrode;
a driving voltage line formed over the interlayer insulating film and configured to supply a voltage to the driving TFT,
wherein the driving voltage line is formed on a same layer as the second electrode,
a first via layer formed over the interlayer insulating film and having first and second opening portions exposing portions of an upper surface of the interlayer insulating film;
a second via layer formed over an upper portion of the first via layer and having a first via hole and a second via hole; and
a bridge formed over an upper portion of the second via layer and configured to electrically connect the second electrode to the driving voltage line.

9. A thin film transistor (TFT) array substrate comprising:
a substrate;
a driving TFT and a switching TFT formed over the substrate, wherein the driving TFT comprises a driving gate electrode, and wherein the switching TFT comprises a gate, source and drain electrodes;
a storage capacitor comprising a first electrode electrically connected to the driving gate electrode and a second electrode formed over and insulated from the first electrode;
an interlayer insulating film at least partially covering the first electrode and the gate electrode of the switching TFT; and
a first via layer formed over an upper surface of the interlayer insulating film and having first and second opening portions exposing portions of the upper surface of the interlayer insulating film,
wherein the second electrode is formed in the first opening portion on the upper surface of the interlayer insulating film and is formed of a same material as the source and drain electrodes of the switching TFT.

10. The thin film transistor array substrate of claim 9, further comprising a driving voltage line formed over the interlayer insulating film and configured to supply a voltage to the driving TFT, wherein the driving voltage line is formed in the second opening portion on the upper surface of the interlayer insulating film.

11. The thin film transistor array substrate of claim 10, wherein the driving voltage line is formed over a same layer as the second electrode.

12. The thin film transistor array substrate of claim 10, wherein the driving voltage line and the second electrode are each in direct contact with the interlayer insulating film.

13. The thin film transistor array substrate of claim 9, wherein the interlayer insulating film is formed of an organic material.

14. The thin film transistor array substrate of claim 9, wherein at least a portion of the driving TFT overlaps the storage capacitor.

15. The thin film transistor array substrate of claim 9, wherein at least a portion of the storage capacitor overlaps the driving TFT.

16. An organic light-emitting diode (OLED) display comprising i) a display region comprising a plurality of pixels and ii) a non-display region surrounding the display region, wherein each of the pixels comprises the TFT array substrate of claim 1.

17. The display of claim 16, further comprising a first via layer formed over an upper surface of the interlayer insulating film and having first and second opening portions exposing portions of the upper surface of the interlayer insulating film.

18. The display of claim 17, wherein the second electrode is formed in the first opening portion on the upper surface of the interlayer insulating film, and wherein the driving voltage line is formed in the second opening portion on the upper surface of the interlayer insulating film.

19. The display of claim 17, further comprising:
- a second via layer formed over an upper portion of the first via layer and having a first via hole and a second via hole, and
- a bridge formed over an upper portion of the second via layer and electrically connecting the second electrode to the driving voltage line.

20. The display of claim 16, wherein the interlayer insulating film is formed of an organic material.

21. The display of claim 16, further comprising a switching TFT formed over the substrate and comprising source and drain electrodes formed of a same material as the second electrode.

* * * * *